(12) United States Patent
Kleeberger et al.

(10) Patent No.: US 11,829,227 B2
(45) Date of Patent: Nov. 28, 2023

(54) STORAGE CIRCUIT WITH HARDWARE READ ACCESS

(71) Applicant: Infineon Technologies AG, Neubiberg (DE)

(72) Inventors: Veit Kleeberger, Munich (DE); Rafael Zalman, Markt Schwaben (DE)

(73) Assignee: Infineon Technologies AG, Neubiberg (DE)

( * ) Notice: Subject to any disclaimer, the term of this patent is extended or adjusted under 35 U.S.C. 154(b) by 474 days.

(21) Appl. No.: 16/985,509

(22) Filed: Aug. 5, 2020

(65) Prior Publication Data

US 2022/0043705 A1    Feb. 10, 2022

(51) Int. Cl.
| | | |
|---|---|---|
| G11C 29/38 | (2006.01) | |
| G06F 11/07 | (2006.01) | |
| H03K 3/0233 | (2006.01) | |
| H03K 19/1776 | (2020.01) | |
| H03K 19/17756 | (2020.01) | |
| H03K 19/096 | (2006.01) | |
| G06F 13/16 | (2006.01) | |

(52) U.S. Cl.
CPC ........ *G06F 11/0772* (2013.01); *G06F 11/076* (2013.01); *G06F 11/0757* (2013.01); *G06F 13/1605* (2013.01); *G11C 29/38* (2013.01); *H03K 3/0233* (2013.01); *H03K 19/096* (2013.01); *H03K 19/1776* (2013.01); *H03K 19/17756* (2013.01)

(58) Field of Classification Search
None
See application file for complete search history.

(56) References Cited

U.S. PATENT DOCUMENTS

| | | | | |
|---|---|---|---|---|
| 6,141,774 A | * | 10/2000 | Mattheis | G06F 11/0757 |
| | | | | 714/E11.006 |
| 9,823,983 B2 | * | 11/2017 | Baca | G06F 11/1641 |
| 2003/0005241 A1 | * | 1/2003 | Ueno | G06F 12/1425 |
| | | | | 711/158 |
| 2019/0227867 A1 | * | 7/2019 | Ellur | G11C 29/022 |

FOREIGN PATENT DOCUMENTS

JP    4114004 B2  *  7/2008

* cited by examiner

*Primary Examiner* — Cynthia Britt
*Assistant Examiner* — Matthew W Wahlin
(74) *Attorney, Agent, or Firm* — Banner & Witcoff Ltd.

(57) ABSTRACT

A method for configuring a storage circuit, including: writing data via an input line into the storage circuit by a software write access; writing a bit-wise inverted form of the data via the input line into the storage circuit by a subsequent software write access; and generating an error signal if a comparison based on the written data and the written bit-wise inverted form of the data indicates a storage circuit configuration error, wherein the storage circuit permits hardware read access and lacks software read access.

20 Claims, 3 Drawing Sheets

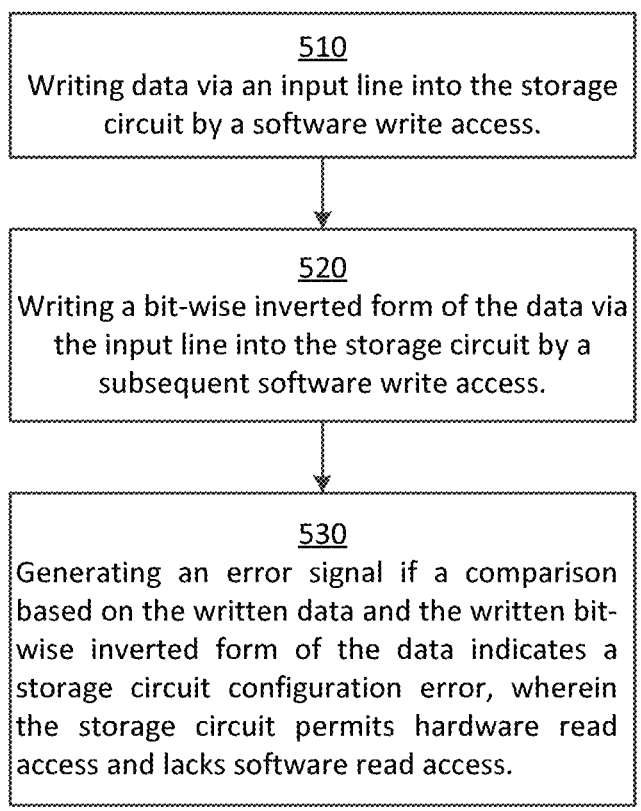

STORAGE CIRCUIT WITH HARDWARE READ ACCESS

BACKGROUND

Functional safety and cybersecurity are important aspects of automotive electronic systems. Storage elements are traditionally designed primarily based on functional safety, and then cybersecurity features are added afterwards. A drawback of this approach is that a functionally safe configuration cannot be easily integrated within a pre-existing design. Also, adding cybersecurity after functional safety leaves content for a time without cybersecurity protection, thereby providing additional attack opportunities.

BRIEF DESCRIPTION OF THE DRAWINGS

FIG. 5 illustrates a flowchart of a method for configuring a storage circuit in accordance with aspects of the disclosure.

DETAILED DESCRIPTION

The present disclosure is directed to a storage circuit having both functional safety and cybersecurity as inherent aspects.

Figure 1:
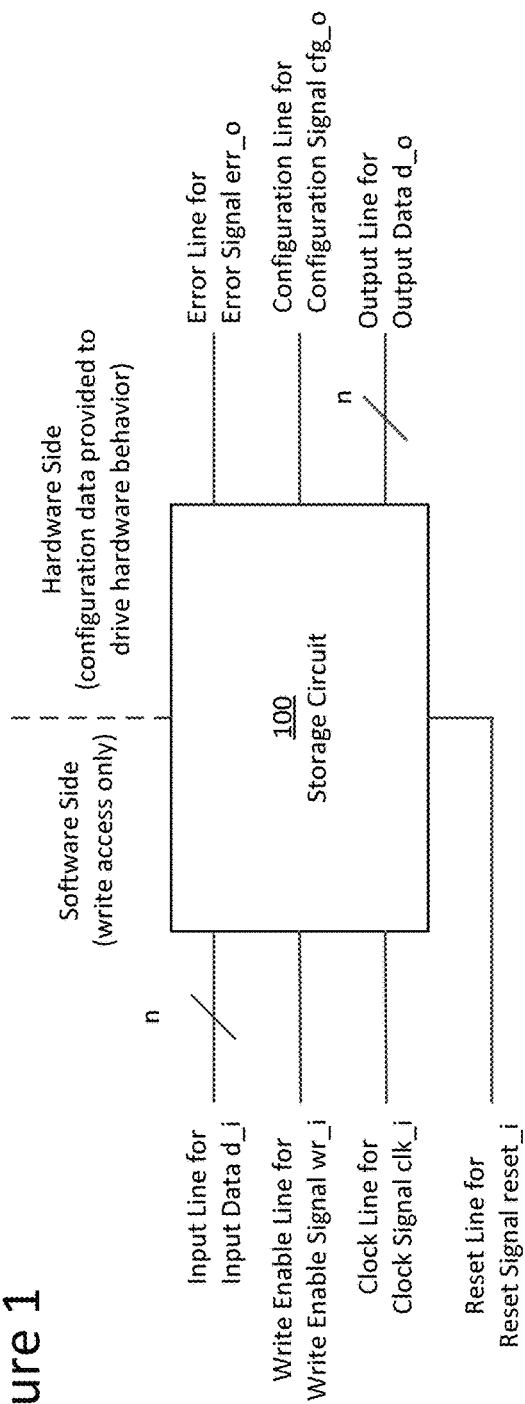
FIG. 1 illustrates schematic diagram of a generic version of a storage circuit in accordance with aspects of the disclosure.

FIG. 1 illustrates a schematic diagram of a generic version of a storage circuit 100 in accordance with aspects of the disclosure.

The storage circuit 100 is logically divided into a software side and a hardware side. The software side has write access, such as for new configuration data, but no read access. The hardware side outputs configuration data to drive hardware, but is not configured for a software read access.

Figure 3:
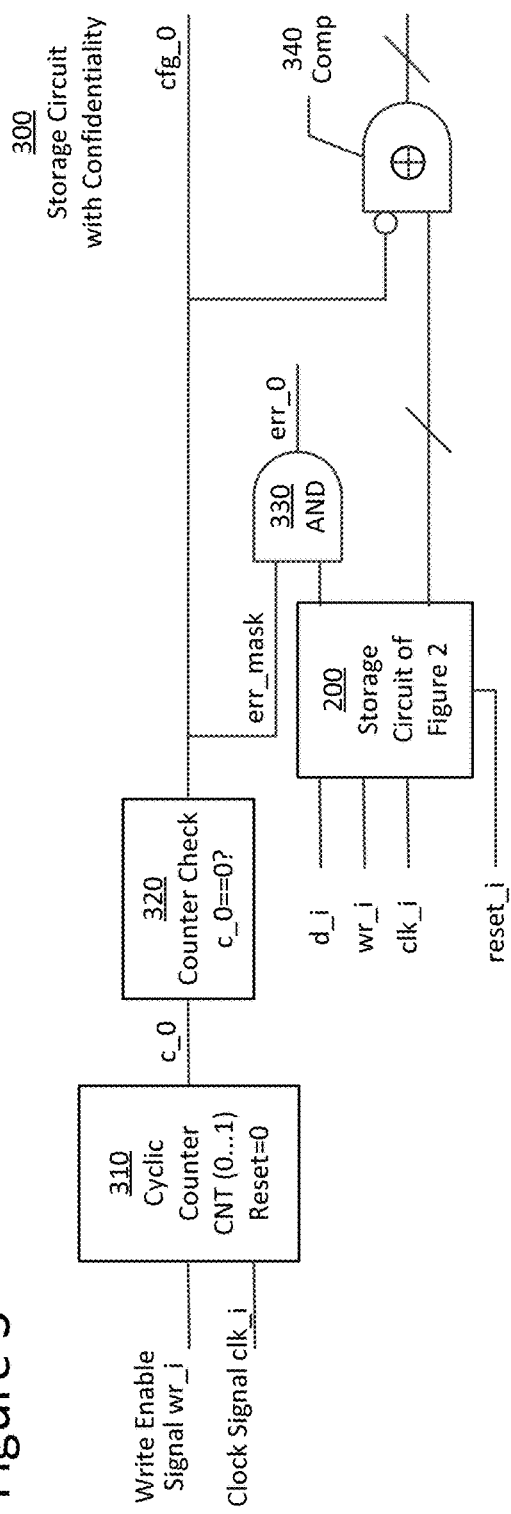
FIG. 3 illustrates a schematic diagram of another example storage circuit with confidentiality in accordance with aspects of the disclosure.
Figure 4:
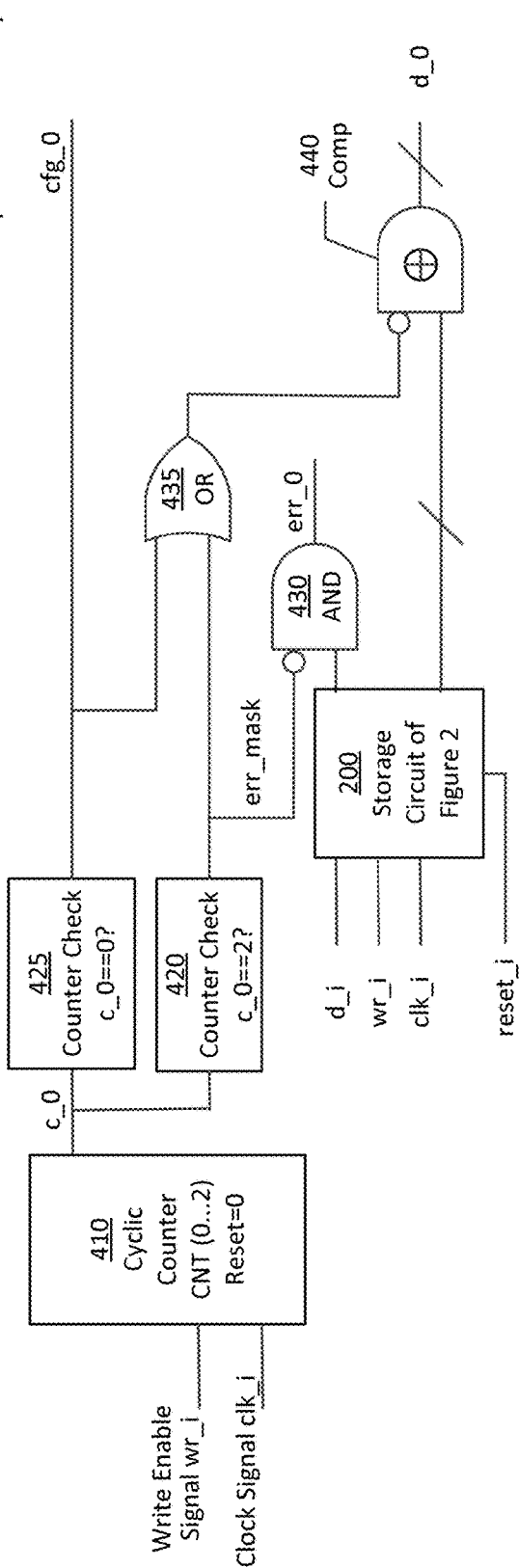
FIG. 4 illustrates a schematic diagram of a storage circuit with confidentiality and authenticity in accordance with aspects of the disclosure.

The storage circuit 100 may be configured with new configuration data via at least one of two approaches—a first approach that provides confidentiality (described with respect to FIG. 3), and a second approach that provides both confidentiality and authenticity (described with respect to FIG. 4). The description presents these two approaches in an overview with respect to FIG. 1, followed by detailed examples with respect to FIGS. 2-4.

First Approach: Storage Circuit 100 Provides Confidentiality (FIG. 3)

With this first approach, configuration of the storage circuit 100 with new configuration data is realized with a two-step sequence.

1. The first step is writing new configuration data by software.
2. The second step is writing a bit-wise inverted version of the new configuration data by software. An error signal is generated if there is a bit error in the new configuration data or the bit-wise inverted version of the new configuration data.

Conventional configurations of storage circuits include writing configuration data into the storage circuit by software, reading the configuration data from the storage element by software, and then comparing the written and read versions of the configuration data to ensure that the storage circuit is configured correctly. An example of a fault is a stuck-at-zero hardware fault 0. For example, if the software attempts to write bit pattern 1111 and there is a stuck-at-zero fault in bit 2, the hardware-side would receive 1011. If the software reads back the written configuration data, the software reads 1011. The fault is identified by a software comparison of the configuration data intended to be written (1111) and the configuration data read (1011).

Unlike the conventional storage circuits, the storage circuit 100 of the present disclosure detects stuck-at-zero faults without reading the written configuration data. In the first step mentioned above, the software writes the new configuration data (e.g., in this case, 1111; hardware receives 1011). In the second step the software writes a bit-wise inverted version of the new configuration data (e.g., 0000; hardware receives 0000). The storage circuit 100 identifies the stuck-at-zero fault without having to do a software read, as described in detail further below.

Second Approach: Storage Circuit 100 Provides Confidentiality and Authenticity (FIG. 4)

With this second approach, configuration of the storage element 100 is realized with a three-step sequence. The second and third steps are the same as the first and second steps described above with respect to the first approach. However, this approach adds an initial step (first step here) to provide authenticity.

1. The first step is to write data that should correspond with currently stored configuration data by software, similar to entering a password for access. During a first write to the storage circuit, this currently-stored configuration data may be a reset value. An access denied or an error signal is generated if the written data does not correspond with the currently stored configuration data.
2. The second step (similar to first step of the first approach described above) is writing new configuration data by software.
3. The third step (similar to second step of the first approach described above) is writing a bit-wise inverted version of the new configuration data by software. An error signal is generated if there is a bit error in the new configuration data or the bit-wise inverted version of the new configuration data.

Referring to FIG. 1, the storage circuit 100 comprises an input line, an output line, a configuration line, and an error line. The first and second approaches allow new configuration (input) data d_i having an n-bit-width to be written to the storage circuit 100 by software via the input line. This input line does not provide a read access. The output line provides the configuration data stored in the storage circuit 100 to drive hardware behavior. The output line does not provide a software read access. If an error occurs, during the configuration or runtime, the error line outputs an error signal err_o. The error signal err_o may be used to trigger a system error reaction, such as to raise an alarm inside another hardware unit, or trigger a pin for error notification outside the system.

The configuration line provides a configuration signal cfg_o, which indicates when the storage circuit 100 is in the process of being configured with new configuration data. The configuration signal cfg_o may be 0 while a (re)configuration is ongoing, and 1 once the (re)configuration sequence is complete, but the disclosure is not limited in this respect.

The configuration signal cfg_o may be used to control a timer (not shown) to ensure that the configuration time does not exceed a threshold configuration time limit. If the configuration time exceeds a threshold configuration time limit, the timer signals the storage circuit 100 to generate the error signal. Alternatively, if the configuration time exceeds a threshold configuration time limit, the timer may be configured to signal the storage circuit 100 to output, in place of the written data, default data which is considered to be safe and/or secure, or data written to the storage circuit 100 during a prior configuration.

The storage circuit 100 also comprises a write enable line, a clock line, and a reset line. The write enable line is for receiving a write enable signal wr_i, which allows data to be written to the storage circuit 100. The clock line is for receiving a clock signal clk_i to coordinate actions of the storage circuit 100. And the reset line is for receiving a reset signal reset_i for resetting storage circuit elements within the storage circuit 100.

Figure 2:
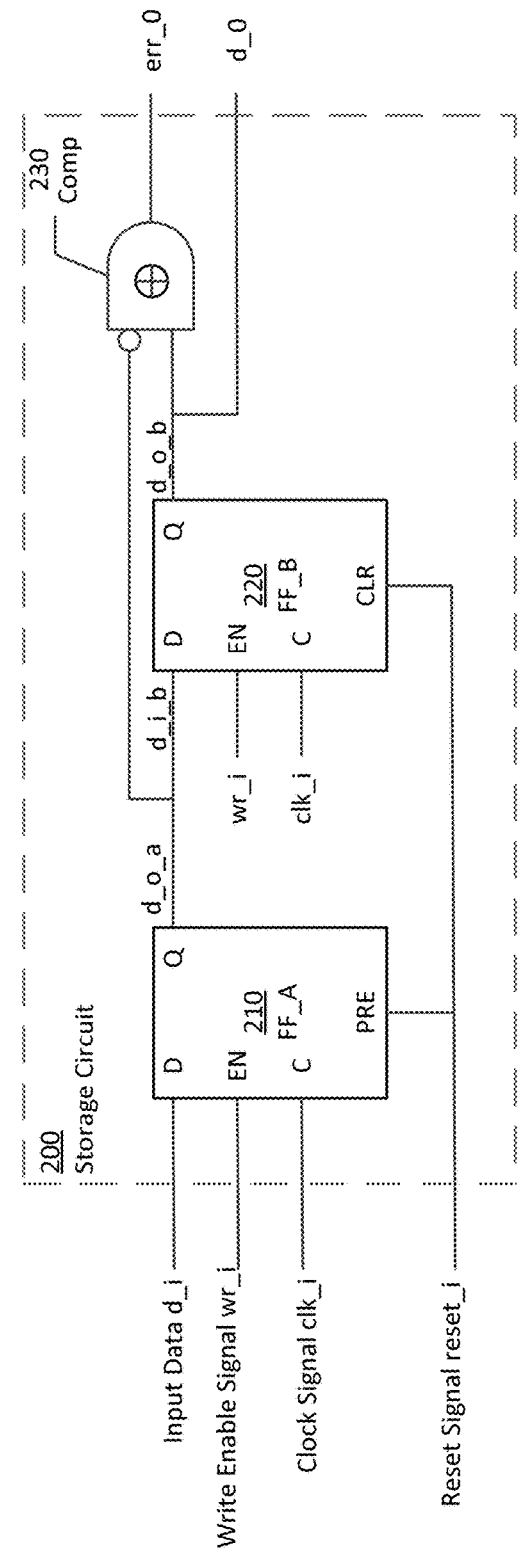
FIG. 2 illustrates a schematic diagram of an example storage circuit in accordance with aspects of the disclosure.

FIG. 2 illustrates a schematic diagram of an example storage circuit 200 in accordance with aspects of the disclosure.

The storage circuit 200 comprises a first storage circuit element 210, a second storage circuit element 220, and a comparator 230. In this example, the first and second storage circuit elements 210, 220 are cascaded D-type flip-flops (FF_A and FF_B), that is a D-type flip-flop with Dual Modular Redundancy (DMR). The comparator 230 is an exclusive OR (XOR) gate with one input inverted. It is appreciated that the disclosure is not limited to DMR; the storage circuit may use any suitable redundancy, such as error detecting codes, parity bits, or the like. Moreover, the disclosure is not limited to D-type flip-flips and/or an XOR gate, but may be any circuit elements as suitable. For example, the D-type flip-flops may be another type of flip-flop, or alternatively, latches.

The first flip-flop 210 comprises an input terminal D for receiving input data d_i, an enable terminal EN for receiving a write enable signal wr_i, a clock terminal C for receiving a clock signal clk_i, a reset PRE terminal for receiving a reset signal reset_i, and an output terminal Q for outputting output data d_o_a.

The second flip-flop 220 comprises an input terminal D for receiving the output data d_0_a of the first flip-flop 210 as input data d_i_b, an enable terminal EN for receiving the write enable signal wr_i, a clock terminal C for receiving the clock clk_i, a clear terminal CLR for receiving the reset signal reset_i, and an output terminal Q for outputting an output data d_o_b, which is the output data d_o of the storage circuit 200.

The comparator 230 is configured to compare an inverted version of the output data d_o_a of the first flip-flip 210 with the output data d_o_b of the second flip-flip 220, and output an error signal err_o.

During runtime, the first and second flip-flops 210, 220 of the storage circuit 200 are configured to receive new configuration data by a software write access, and to receive a bit-wise inverted form of the new configuration data by a subsequent software write access. The cascaded first and second flip-flops 210, 220 are configured to store the written new configuration data and the written inverted form of the new configuration data.

The comparator 230 is configured to generate an error signal err_o if a comparison based on the written new configuration data and the written bit-wise inverted form of the new configuration data indicates that the configuration data has a configuration error, such as a bit error. The storage circuit 200 outputs, via output terminal Q of flip-flop 220, configuration data to drive hardware; no software read access path is provided. The storage circuit 200 is instantiated n-times according to a bit-width of the input/configuration data d_i.

During a reset, the cascaded first and second flip-flops 210, 220 are configured to write, prior to writing the data during the software write access, reset data by a software reset write access. If the reset data corresponds with prior data written via the input line into the storage circuit by a software access, the storage circuit is configured to write the data received by the software write access. On the other hand, if the reset data does not correspond with prior data written via the input line into the storage circuit by a software access, the storage circuit is configured to prevent the writing of the data received by the software write access.

An example of the storage circuit 200 during runtime is as follows:

After reset: FF_A (d_o_a)=1; FF_B (d_o_b)=0; err_o=not (FF_A) XOR FF_B=0; and d_o=0.

When programming new configuration data having a value of 1 into the storage circuit 200 using the first approach having the two-step sequence described above:

Step 1 (write 1→FF_A=1): FF_B=1; err_o=1; and d_o=1.

Step 2 (write 0→FF_A=0): FF_B=1; err_o=0; and d_o=1.

FIG. 3 illustrates a schematic diagram of a storage circuit 300 with confidentiality (two-step first approach) in accordance with aspects of the disclosure.

Structurally, the storage circuit 300 is similar to storage circuit 200 of FIG. 2, but additionally comprises a mask and a comparator 340. The mask is formed by a cyclic counter 310, a counter check 320, and an OR gate 330. The cyclic counter 310 in combination with the counter check 320 outputs a mask error signal err_mask for masking the error signal err_o during the first step when the new configuration data d_i is written, but not for the second step when the bit-wise inverted form of the new configuration data is written. A spurious error that occurs during reprogramming causes the error signal err_o to not be accurate during the first step of the two-step approach. During this time the bit-wise inverted version of the new configuration data has not yet been written, causing the output of the comparator 230 to output a false error. The mask prevents output of the false error. After the bit-wise inverted form of the new configuration data is written, the mask is removed to output the error signal err_o.

More specifically, the cyclic counter 310 is configured to count with each clock cycle, when wr_i=1, a write count alternating between 0 and 1 to correspond with the first and second steps, respectively. The counter check 320 is configured to determine when the write count c_0 is logical 0, indicating the first step when the new configuration data d_i is written, and output a logical 1 as the mask error signal mask_err and the configuration signal cfg_o. Conversely, when the write count c_0 is a logical 1, indicating the second step when the bit-wise inverted version of the new configuration data is written, and output a logical 0. The AND gate 330 is configured to perform a logical AND of the mask error signal mask_err and the data output signal d_o (=d_o_b) of the storage circuit 200, and output the error signal err_o.

The comparator 340, which is an exclusive OR (XOR) gate with one input inverted, resolves an error in the data output signal d_o that occurs during the first write access. The comparator 340 is configured to ensure that during the first write access of the new configuration data, the previous configuration data value is still provided. Specifically, the comparator 340 compares an inverted version of the mask error signal err_mask of the counter check 320 with the data output signal d_o of the storage circuit 200.

An example of the storage circuit 300 during runtime is as follows:

After reset: c_o=0; cfg_o=1; err_o=0; and d_o=0.

When programming new configuration data having a value of 1 into the storage circuit 300 using the first approach having a two-step sequence:

Step 1 (write d_i=1)→c_o=1; cfg_o=err_mask=0; err_o=0; and d_o=0.

Step 2 (write d_i=0)→c_o=0; cfg_o=err_mask=1; err_o=0; and d_o=1.

FIG. 4 illustrates a schematic diagram of a storage circuit 400 with confidentiality and authenticity (three-step second approach) in accordance with aspects of the disclosure.

Structurally, the storage circuit 400 is similar to storage circuit 300 of FIG. 3, but additionally comprises a second counter check 425 and an additional OR gate 435. Cyclic counter 410 is similar to cyclic counter 310, but cyclic counter 410 counts between 0 and 2, rather than between 0 and 1, due to the three-step approach rather than the two-step approach. The second counter check 425 and the additional OR gate 435 are provided for the additional count. The AND gate 430 comprises an additional inverted input compared to the AND gate 330. The circuit elements in FIGS. 3 and 4 have similar reference numerals but with the first digit corresponding with the figure number. A more detailed written description of storage circuit 400 is not deemed to be necessary, and thus for the sake of brevity, is not provided here.

An example of the storage circuit 400 being reconfigured with new configuration data is now described.

After reset: c_o=0; cfg_o=1; err_o=0; and d_o=0.

When programming new configuration data having a value of 1 into the storage circuit 400, using the second approach having a three-step sequence:

Step 1 (write current stored value→d_i=0)→c_o=1; cfg_o=0; err_mask=0; err_o=0; and d_o=0.

Step 2 (write new value d_i=1)→c_o=2; cfg_o=0; err_o=0; err_mask=1; and d_o=0.

Step 3 (write new value inverted d_i=0)→c_o=0; cfg_o=1; err_o=0; err_mask=0; and d_o=1.

FIG. 5 illustrates a flowchart 500 of a method for configuring a storage circuit 100/200/300/400 in accordance with aspects of the disclosure.

Step 510 is writing data via an input line into the storage circuit 100/200/300/400 by a software write access.

Step 520 is writing a bit-wise inverted form of the data via the input line into the storage circuit 100/200/300/400 by a subsequent software write access.

Step 530 is generating an error signal err_o if a comparison based on the written data d_i and the written bit-wise inverted form of the data indicates a storage circuit configuration error, wherein the storage circuit 100/200/300/400 permits hardware read access and lacks software read access.

The disclosed storage circuit lacking a read path ensures confidentiality by providing a safe configuration via the two-step write of new configuration data. The auto-lock mechanism of the second approach provides protection from tampering by preventing unauthorized reprogramming. The storage circuit 100/200/300/400 itself stores configuration data with redundancy (e.g., dual-modular redundancy, error detecting code, or the like) to detect runtime faults, either due to an attack or due to safety-related faults such as a single event upset.

The storage circuit 100/200/300/400 of the present disclosure detect faults on an access path otherwise only detectable by a read-back or similar mechanism. A double software write as described herein is less expensive than a write plus read-back, hence the disclosed storage circuit 100/200/300/400 improves software execution time. The storage circuit 100/200/300/400 allows reconfiguration based on knowledge of a current configuration value instead of fixed assignments (e.g., via bus TAG IDs), which helps decrease vulnerabilities with respect to compromised software.

The techniques of this disclosure may also be described in the following examples.

Example 1. A method for configuring a storage circuit, comprising: writing data via an input line into the storage circuit by a software write access; writing a bit-wise inverted form of the data via the input line into the storage circuit by a subsequent software write access; and generating an error signal if a comparison based on the written data and the written bit-wise inverted form of the data indicates a storage circuit configuration error, wherein the storage circuit permits hardware read access and lacks software read access.

Example 2. The method of claim 1, further comprising: masking the error signal for a clock cycle during the writing of the data.

Example 3. The method of claim 1, further comprising: generating a configuration signal that indicates when the storage circuit is being configured.

Example 4. The method of claim 3, further comprising: controlling a timer to determine a configuration time during which the storage circuit is being configured; and generating an alarm signal if the configuration time exceeds a threshold configuration time limit.

Example 5. The method of claim 3, further comprising: controlling a timer to determine a configuration time during which the storage circuit is being configured; and configuring the storage circuit to output default data or data written to the storage circuit during a prior configuration of the storage circuit, if the configuration time exceeds a threshold configuration time limit.

Example 6. The method of claim 1, further comprising: reading, via an outline line of the storage circuit, the written data by a hardware read access.

Example 7. The method of claim 1, further comprising: prior to writing the data during the software write access, writing reset data via the input line into the storage circuit by a software reset write access; and allowing the writing of the data if the reset data corresponds with prior data written via the input line into the storage circuit by a software access.

Example 8. The method of claim 1, further comprising: prior to the writing the data during the software write access, writing reset data via the input line into the storage circuit by a software reset write access; and preventing the writing of the data or generating an error signal if the reset data does not correspond with prior data written via the input line into the storage circuit by a software access.

Example 9. The method of claim 1, wherein the storage circuit comprises cascaded first and second storage circuit elements for storing the written data and the written inverted form of the data.

Example 10. The method of claim 1, wherein the storage circuits comprise flip-flops or latches.

Example 11. A storage circuit, comprising: cascaded first and second storage circuit elements, configured to write data received by a software write access, and to write a bit-wise inverted form of the data received by a subsequent software write access; and a comparator configured to generate an error signal if a comparison based on the written data and the written bit-wise inverted form of the data indicates a storage circuit configuration error, wherein the storage circuit permits hardware read access and lacks software read access.

Example 12. The storage circuit of claim 11, further comprising: a mask configured to mask the error signal during a clock cycle when the first storage circuit element receives the data.

Example 13. The storage circuit of claim 12, further comprising: a cyclic counter configured to count write accesses based on an input signal wr_i and output a masking signal to the mask indicating when to mask the error signal.

Example 14. The storage circuit of claim 11, further comprising: wherein the storage circuit is configured to generate a configuration signal that indicates when the storage circuit is being configured.

Example 15. The storage circuit of claim 14, further comprising: a timer configured to determine a configuration time during which the storage circuit is being configured, and if the configuration time exceeds a threshold configuration time limit, to generate an alarm signal.

Example 16. The storage circuit of claim 14, further comprising: a timer configured to determine a configuration time during which the storage circuit is being configured, and if the configuration time exceeds a threshold configuration time limit, signal the storage circuit to output, in place of the written data, default data or data written to the storage circuit during a prior configuration of the storage circuit.

Example 17. The storage circuit of claim 11, further comprising: an output line configured to output the written data in response to a hardware read access.

Example 18. The storage circuit of claim 11, wherein the cascaded first and second storage circuit elements are further configured to write, prior to writing the data during the software write access, reset data by a software reset write access, and wherein if the reset data corresponds with prior data written via the input line into the storage circuit by a software access, the storage circuit is configured to write the data received by the software write access.

Example 19. The storage circuit of claim 11, further comprising: wherein the cascaded first and second storage circuit elements are further configured to write, prior to writing the data during the software write access, reset data by a software reset write access, and wherein if the reset data does not correspond with prior data written via the input line into the storage circuit by a software access, the storage circuit is configured to prevent the writing of the data received by the software write access.

Example 20. The storage circuit of claim 11, wherein the storage circuits comprise flip-flops or latches.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A method, comprising:
providing a storage circuit that is logically divided into a hardware portion and a software portion, and is designed to permit hardware read access and prevent software read access;
writing data via an input line directly into the storage circuit by an initial software write access;
writing a bit-wise inverted form of the data via the input line directly into the storage circuit by a subsequent software write access; and
generating an error signal when a comparison based on the written data and the written bit-wise inverted form of the data indicates a storage circuit configuration error.

2. The method of claim 1, further comprising:
masking the error signal for a clock cycle during the writing of the data.

3. The method of claim 1, further comprising:
generating a configuration signal that indicates when the storage circuit is being configured.

4. The method of claim 3, further comprising:
controlling a timer to determine a configuration time during which the storage circuit is being configured; and
generating an alarm signal when the configuration time exceeds a threshold configuration time limit.

5. The method of claim 3, further comprising:
controlling a timer to determine a configuration time during which the storage circuit is being configured; and
configuring the storage circuit to output default data or data written to the storage circuit during a prior configuration of the storage circuit, when the configuration time exceeds a threshold configuration time limit.

6. The method of claim 1, further comprising:
reading, via an outline line of the storage circuit, the written data by a hardware read access.

7. The method of claim 1, further comprising:
prior to writing the data during the software write access, writing reset data via the input line into the storage circuit by a software reset write access; and
allowing the writing of the data when the reset data corresponds with prior data written via the input line into the storage circuit by a software access.

8. The method of claim 1, further comprising:
prior to the writing the data during the software write access, writing reset data via the input line into the storage circuit by a software reset write access; and
preventing the writing of the data or generating an error signal when the reset data does not correspond with prior data written via the input line into the storage circuit by a software access.

9. The method of claim 1, wherein the storage circuit comprises cascaded first and second storage circuit elements for storing the written data and the written inverted form of the data.

10. The method of claim 1, wherein the storage circuits comprise flip-flops or latches.

11. A storage circuit, comprising:
cascaded first and second storage circuit elements, designed to directly write data received by a software write access, and to directly write a bit-wise inverted form of the data received by a subsequent software write access; and
a comparator designed to generate an error signal when a comparison based on the written data and the written bit-wise inverted form of the data indicates a storage circuit configuration error,
wherein the storage circuit is logically divided into a hardware portion and a software portion, and is designed to permit hardware read access and prevent software read access.

12. The storage circuit of claim 11, further comprising:
a mask designed to mask the error signal during a clock cycle when the first storage circuit element receives the data.

13. The storage circuit of claim 12, further comprising:
a cyclic counter designed to count write accesses based on an input signal wr_i and output a masking signal to the mask indicating when to mask the error signal.

14. The storage circuit of claim 11, further comprising:
wherein the storage circuit is designed to generate a configuration signal that indicates when the storage circuit is being configured.

15. The storage circuit of claim 14, further comprising:
a timer designed to determine a configuration time during which the storage circuit is being configured, and when the configuration time exceeds a threshold configuration time limit, to generate an alarm signal.

16. The storage circuit of claim 14, further comprising:
a timer designed to determine a configuration time during which the storage circuit is being configured, and when the configuration time exceeds a threshold configuration time limit, signal the storage circuit to output, in place of the written data, default data or data written to the storage circuit during a prior configuration of the storage circuit.

17. The storage circuit of claim 11, further comprising:
an output line designed to output the written data in response to a hardware read access.

18. The storage circuit of claim 11,
wherein the cascaded first and second storage circuit elements are further designed to write, prior to writing the data during the software write access, reset data by a software reset write access, and
wherein when the reset data corresponds with prior data written via the input line into the storage circuit by a software access, the storage circuit is designed to write the data received by the software write access.

19. The storage circuit of claim 11, further comprising:
wherein the cascaded first and second storage circuit elements are further designed to write, prior to writing the data during the software write access, reset data by a software reset write access, and
wherein when the reset data does not correspond with prior data written via the input line into the storage circuit by a software access, the storage circuit is designed to prevent the writing of the data received by the software write access.

20. The storage circuit of claim 11, wherein the storage circuits comprise flip-flops or latches.

* * * * *